United States Patent
Borland et al.

(10) Patent No.: US 7,029,971 B2
(45) Date of Patent: Apr. 18, 2006

(54) THIN FILM DIELECTRICS FOR CAPACITORS AND METHODS OF MAKING THEREOF

(75) Inventors: William J. Borland, Cary, NC (US); Jon Fredrick Ihlefeld, Raleigh, NC (US); Angus Ian Kingon, Cary, NC (US); Jon-Paul Maria, Raleigh, NC (US)

(73) Assignees: E. I. du Pont de Nemours and Company, Wilmington, DE (US); Norch Carolina State University, Raleigh, NC (US)

( * ) Notice: Subject to any disclaimer, the term of this patent is extended or adjusted under 35 U.S.C. 154(b) by 337 days.

(21) Appl. No.: 10/621,796

(22) Filed: Jul. 17, 2003

(65) Prior Publication Data
US 2005/0011857 A1 Jan. 20, 2005

(51) Int. Cl.
 *H01L 21/8242* (2006.01)
(52) U.S. Cl. ............... 438/250; 438/251; 438/393; 438/394
(58) Field of Classification Search ........ 438/250–252, 438/393–395; 29/620–621; 428/210–212
See application file for complete search history.

(56) References Cited

U.S. PATENT DOCUMENTS

| | | | |
|---|---|---|---|
| 5,198,269 A | 3/1993 | Swartz et al. | |
| 5,271,955 A | 12/1993 | Maniar | |
| 5,342,648 A | 8/1994 | MacKenzie et al. | |
| 5,384,294 A | 1/1995 | Teowee et al. | |
| 5,391,393 A | 2/1995 | Maniar | |
| 5,962,654 A | 10/1999 | Duncombe et al. | |
| 6,287,673 B1* | 9/2001 | Katsir et al. ................ | 428/210 |
| 6,337,032 B1 | 1/2002 | Chivukula et al. | |
| 6,541,137 B1 | 4/2003 | Kingon et al. | |
| 6,631,551 B1* | 10/2003 | Bowles et al. ............... | 29/620 |
| 6,638,387 B1* | 10/2003 | Cruz .......................... | 156/219 |
| 2002/0195612 A1 | 12/2002 | Farrell | |

FOREIGN PATENT DOCUMENTS

WO  WO 01/67465 A2  9/2001

OTHER PUBLICATIONS

D. M. Smyth, The Defect Chemistry of Metal Oxides, Oxford University Press, 2000, pp. 252-282.

M. N. Kamalasaan, N. D. Kumar and S. Chandra, Dielectric and ferroelectric properties of BaTiO3 thin films grown by the sol-gel process, J. Appl. Phys. 74 (9), Nov. 1, 1983, pp. 5679-5686.

Q. Zou, H. E. Ruda and B. G. Yacobi, Dielectric properties of lead zirconate titanate thin films deposited on metal foils, Applied Physics Letters, vol. 77, No. 7, Aug. 14, 2000, pp. 1038-1040.

(Continued)

*Primary Examiner*—Dung A. Le

(57) ABSTRACT

Dielectrics are formed having high dielectric constants, low loss tangents, and other desirable electrical and physical properties. The dielectrics are annealed at temperatures allowing the use of copper foil substrates, and at low oxygen partial pressures.

28 Claims, 8 Drawing Sheets

OTHER PUBLICATIONS

Q. Zou, H. E. Ruda and B. G. Yacobi, Improved dielectric properties of lead zirconate titanate thin films deposited on metal foils with LaNiO3 buffer layers, Applied Physics Letters, vol. 78, No. 9, Feb. 26, 2001, pp. 1282-1284.

W. J. Lee and H. G. Kim, Microstructure dependence of electrical properties of (Ba0.5Sr0.5)TiO3 thin films deposited on Pt/SiO2/Si, J. Appl. Phys. 80 (10), Nov. 15, 1996, pp. 5891-5894.

M. H. Frey and D. A. Payne, Nanocrystalline barium titanate: Evidence for the absence of ferroelectricity in sol-gel derived thin-layer capacitors, Appl. Phys. Lett. 63 (20), Nov. 15, 1993, pp. 2753-2755.

B. Lee and J. Zhang, Preparation, structure evolution and dielectric properties of BaTiO3 thin films and powders by an aqueous sol-gel process, Thin Solid Films 388 (2001) 1-7-113.

X. Li and W. H. Shih, Size Effects in Barium Titanate Particles and Clusters, J. Am. Comm. Soc. 80 (11) 1997, pp. 2844-2852

M. N. Kamalasanan, N. D. Kumar, and S. Chandra, Structural, optical, and dielectric properties of sol-gel derived SrTiO3 thin films, J. Appl. Phys. 74 (1), Jul. 1993, pp. 679-686.

J. P. Maria, K. Cheek, S. Streiffer, S. H. Kim, G. Dunn and A. Kingon, Lead Zirconate Titanate Thin Films on Base-Metal Foils: An Approach for Embedded High-Permittivity Passive Components, J. Am. Ceram. Soc. vol. 84, No. 10, (2001), pp. 2436-2438.

M. H. Frey and D. A. Payne, Grain-size effect on structure and phase transformations for barium titanate, Physical Review B, vol. 54, No. 5, Aug. 1, 1996, pp. 3158-3168.

E. Dien, J. B. Briot, M. Lejeune and A. Smith, Relationship Between Processing and lectrical Behavior of BST Films Deposited by Spin Coating, Journal of the European Ceramic Society, vol. 19, (1999), pp. 1349-1352.

D. M. Tahan, A. Safari and L. C. Klein, Preparation and Characterization of BaxSr1-xTiO3 Thin Films by a Sol-Gel Technique, J. Am. Ceram. Soc., vol. 79, No. 6, (1996), pp. 1593-1598.

R. W. Schwartz, P. G. Clem, J. A. Voigt, E. R. Byhoff, M. Van Stry, T. J. Headley and N. A. Missert, Control of Microstructure and Orientation in Solution-Deposited BaTiO3 and SrTiO3 Thin Films, J. Am. Ceram. Soc., vol. 82, No. 9, (1999), pp. 2359-2367.

M. Losurdo, P. Capezzuto, G. Bruno, G. Perna and V. Capozzi, N2-H2 remote plasma nitridation for GaAs surface passivaton, Applied Physics Letters, vol. 81, No. 1, Jul. 1, 2002, pp. 16-18.

M.N. Kamalasanan, N. Deepak kumar and Subhas Chandra, Structural and microstructural evolution of barium titanate thin films deposited by the sol-gel process, J. Appl. Phys. 76 (8), Oct. 15, 1994, pp. 4603-4609.

N. Deepak Kumar, M.N. Kamalasanan and Subhas Chandra, Metalorganic chemical vapor deposition technique for growing c-axis oriented ZnO thin films in atmospheric pressure air, Appl. Phys. Lett. 65 (11), Sep. 12, 1994, pp. 1373-1375.

J. T. Dawley and P. G. Clem, Dielectric properties of random and <100> oriented SrTiO3 and (Ba,Sr)TlO3 thin films fabricated on <100> nickel tapes, Applied Physics Letters, vol. 81, No. 16, Oct. 14, 2002, pp. 3028-3030.

G. Arlt, D. Hennings and G. De With, Dielectric properties of fine-grained barium titanate ceramics, J. Appl. Phys. 58 (4), Aug. 15, 1985, pp. 1619-1625.

Angus I. Kingon, Taeyun Kim, Jon-Paul Maria, and Robert Croswell, Integation of Thin Film Capacitors into Polymer-Based Wiring Boards or MCM-Ls, NC State University, Department of Materials Science and Engineering. Jun. 13, 2002.

Angus I. Kingon, Taeyun Kim, Paula Vilarinho, Jon-Paul Maria, and Robert Croswell, Thin Film Capacitors Embedded into High Density Printed Circuit Boards, NC State University, Department of Materials Science and Engineering, Oct. 10, 2001.

* cited by examiner

THIN FILM DIELECTRICS FOR CAPACITORS AND METHODS OF MAKING THEREOF

FIELD OF THE INVENTION

The technical field is embedded capacitors. More particularly, the technical field includes capacitors having thin film dielectrics.

BACKGROUND OF THE INVENTION

The practice of embedding capacitors in printed wiring boards (PWB) allows for reduced circuit size and improved circuit performance. Capacitors are typically embedded in panels that are stacked and connected by interconnection circuitry, the stack of panels forming a printed wiring board. The stacked panels can be generally referred to as "innerlayer panels." Embedded capacitors are subject to requirements such as acceptable breakdown voltage, stability of capacitance within specified temperature ranges, low dielectric loss, construction from environmentally acceptable materials, simplicity of manufacture, and amenability to printed circuit board manufacturing techniques. One industry standard, Electrical Industry Association designation X7R, requires that a capacitor's capacitance vary by not more than 15% of its value at 25° C. over a temperature range of 55° C.–125° C. X7R also requires a dissipation factor of less than 2.5%.

The capacitance density of a dielectric is proportional to its permittivity (or dielectric constant K), divided by the thickness of the dielectric. A high capacitance density capacitor can therefore be achieved by using a thin film, high dielectric constant ("high K") dielectric in the capacitor. High K ferroelectric dielectrics include perovskites of the general formula $ABO_3$, such as crystalline barium titanate (BT), lead zirconate titanate (PZT), lead lanthanum zirconate titanate (PLZT), lead magnesium niobate (PMN) and barium strontium titanate (BST).

A requirement for a high K $ABO_3$ material is the formation of a polar non-centrosymmetric phase. A coherent crystalline dimension in the dielectric must be exceeded in order to form the non-centrosymmetric phase (which is commonly tetragonal, but can be rhombohedral, orthorhombic, or monoclinic). The crystalline dimension is related to macroscopic features such as grain size. In general, grain sizes in excess of 0.1 micron are necessary to develop the high K ferroelectric tetragonal phase in barium titanate ($BaTiO_3$). Most conventional thin film methods produce grain sizes of about one tenth of this value and correspondingly low dielectric constants.

Thin ferroelectric films are commonly deposited on silicon substrates, which must be processed at relatively low temperatures. Amorphous ferroelectric films, however, more effectively crystallize to the desired high K phase when annealed at high temperatures. Therefore, low temperature annealing of thin ferroelectric films on silicon may not fully crystallize the dielectric to the preferred crystallographic form.

Thin ceramic films may also be deposited on base-metal foils, such as copper and nickel foils. Base-metal foils are subject to oxidation, however, and require low oxygen partial pressures during high temperature annealing. The low oxygen partial pressures, however, can result in complications such as high dielectric losses due to reduction of the dielectric material, suppression of dielectric constant due to reactions between the thin film dielectric and the base metal foil, and oxidation of the base metal during annealing or subsequent re-oxygenation processes.

U.S. patent application 20020195612 A1 to Farrell teaches that copper is a preferred substrate due to its ready availability. However, thin film composites having copper substrates often evidence thermal migration and outgassing. Farrell discloses nickel plating the copper foil, but nickel plating adds cost and complexity, and the dielectric constant is low. Additionally, the dielectric (PZT in Farrell) contains lead which is undesirable from an environmental standpoint.

U.S. Pat. No. 6,541,137 to Kingon et al. teaches that a high temperature deposition or high temperature annealing is incompatible with copper in two ways. First, at the high temperatures and oxidizing conditions required to form a ceramic dielectric, copper forms a thin layer of copper oxide at the interface between the ceramic dielectric and the copper. The copper oxide effectively forms an interface layer, which degrades overall device performance and negates the advantages gained by the use of the ceramic dielectric. Second, the reducing atmospheres favored for copper produce excessive defect concentrations and may frustrate crystalline phase formation in the dielectric oxide layer.

J. T. Dawley and P. G. Clem, Appl. Phys. Lett., vol. 81, No. 16, (2002), p. 3028 discloses K values of 980–1500 obtained by annealing a chemical solution deposition (CSD) film of barium strontium titanate (BST) at 900° C. Dawley and Clem postulated that the high K value was obtained by orienting the BST on biaxially textured nickel tapes. Non-oriented BST exhibited K values in the range of 270–420. BST grain sizes were on the order of 30–35 nm for random BST and 40–50 nm for oriented BST.

SUMMARY OF THE INVENTION

According to a first embodiment, a method of making a capacitor comprises forming a dielectric over a bare metallic foil, wherein forming the dielectric comprises forming a dielectric layer over the foil, annealing the dielectric layer, and re-oxygenating the dielectric resulting from the annealing. A conductive layer is then formed over the dielectric, wherein the foil, the dielectric, and the conductive layer form a capacitor.

According to another embodiment, a method of making a capacitor comprises forming a dielectric over a metallic foil, wherein forming the dielectric comprises annealing at a temperature of greater than about 800° C. and in an environment having an oxygen partial pressure of less than about $10^{-8}$ atmospheres, and re-oxygenating the dielectric. A conductive layer is then formed over the dielectric, wherein the foil, the dielectric, and the conductive layer form a capacitor.

Capacitors constructed according to the above methods can be embedded into innerlayer panels, which may in turn be incorporated into printed wiring boards. The capacitors have high capacitance densities, low loss tangents, and other desirable electrical and physical properties. Further, the methods according to the present invention may be practiced without the use of specialty gases or equipment, while using environmentally desirable materials.

Those skilled in the art will appreciate the above stated advantages and other advantages and benefits of various additional embodiments of the invention upon reading the following detailed description of the embodiments with reference to the below-listed drawings.

According to common practice, the various features of the drawings discussed below are not necessarily drawn to scale. Dimensions of various features and elements in the drawings may be expanded or reduced to more clearly illustrate the embodiments of the invention.

BRIEF DESCRIPTION OF THE DRAWINGS

The detailed description will refer to the following drawings, wherein like numerals refer to like elements, and wherein.

DETAILED DESCRIPTION OF THE INVENTION

Figure 2:
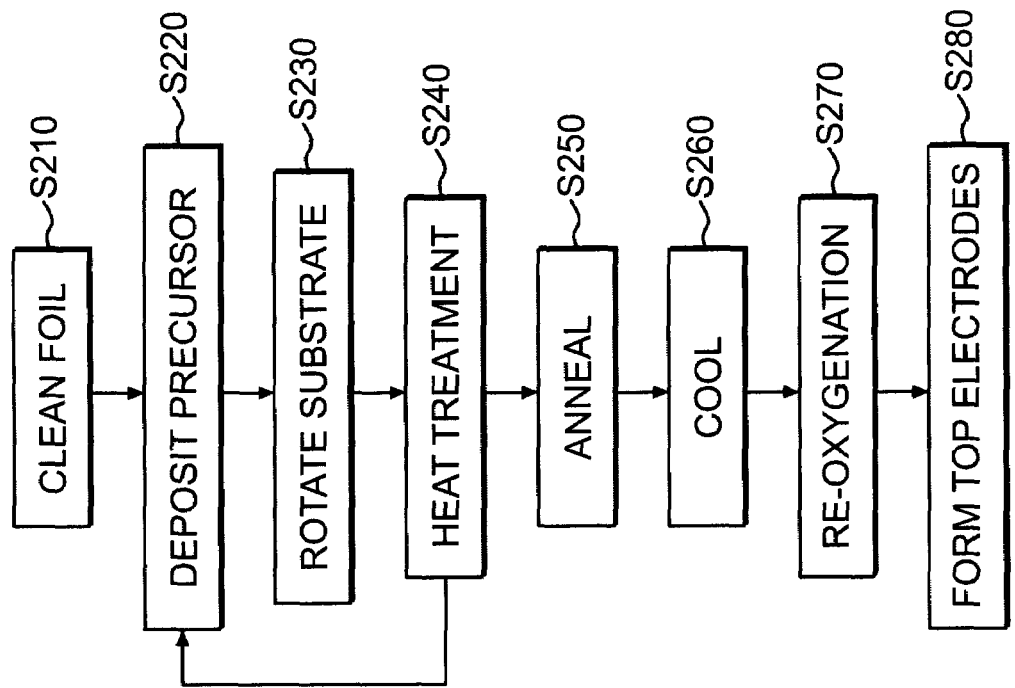
FIG. 2 is a block diagram illustrating a process for making a capacitor.

High capacitance density dielectrics and methods of making thereof are disclosed. Methods of forming capacitors and printed wiring boards incorporating the dielectrics are also disclosed.

The dielectrics according to the present invention may have capacitance densities in excess of 0.5 microFarads per square centimeter, and in another embodiment capacitance densities in excess of 2 microFarads per square centimeter, and in yet another embodiment, capacitance densities in excess of 4 microFarads per square centimeter, for a single layer of dielectric. The high capacitance density dielectrics have acceptable capacitance stability over a desired temperature range, have low dielectric losses, may be constructed from environmentally acceptable materials, and are amenable to printed circuit board manufacturing techniques. In one embodiment, a dielectric is sandwiched between a standard untreated copper (Cu) foil and a conductive layer to form a capacitor. The capacitor is suitable for embedding in a printed wiring board. Manufacturing the embedded capacitor requires few steps and may use chemicals and processes that are common in the printed wiring board industry.

The capacitor embodiments discussed herein include "thin film dielectrics," with dielectric thicknesses in the range of about 0.2–2.0 microns. In other embodiments, the range of dielectric thicknesses is about 0.5–1.0 microns, with capacitance densities between approximately 2–5 microFarads/$cm^2$. Other embodiments may have capacitance densities of 0.5–5 microFarads/$cm^2$. Capacitors of this capacitance density range have a breakdown voltage in excess of about 30 volts. Dielectric constants may be in excess of 600, in some cases 1500, and in some other cases greater than 2000. The capacitor embodiments also have relatively stable capacitance values over a temperature range of 55° C.–125° C., and exhibit low dielectric losses.

Crystalline barium titanate may be used to form high permittivity dielectric films or layers in the capacitor embodiments discussed in this specification. Crystalline barium titanate displays high dielectric constants and enables very high capacitance density devices to be fabricated. The high capacitance densities can be achieved using dielectric thicknesses that are physically robust, preferably between 0.5–1.0 micron, but also in as wide a range as 0.2–2.0 microns. Also, the process conditions used to create the high K barium titanate dielectrics are compatible with processing on copper foils, which are used in many printed wiring board applications. In this specification, barium titanate or $BaTiO_3$ is referred to as a "core material" in the formation of dielectrics according to the present embodiments. However, substituent and dopant cations may be added to $BaTiO_3$ to modify the dielectric characteristics. The specific combination of dopants in $BaTiO_3$ will depend upon the required combination of dielectric properties, transport properties, and temperature-dependent properties required in the resultant capacitor incorporating the dielectric. Examples of dopants are discussed in detail below.

Chemical solution deposition (CSD) techniques may be used to form the dielectrics in the methods of the present invention. CSD techniques are desirable due to their simplicity and low cost. The chemical precursor solution from which undoped (or "pure") $BaTiO_3$ is prepared preferably contains the following chemicals:

Barium acetate
Titanium isopropoxide
Acetylacetone
Acetic acid
Methanol

For a stable precursor solution, the above chemicals should be free of water. Water de-stabilizes the precursor composition, resulting in precipitation of titanium oxide. It is therefore important to prepare and deposit the precursor solution in relatively low humidity environments, such as less than about 40% relative humidity. Once the precursor solution has been fully deposited on a foil and dried, it is less susceptible to humidity.

Figure 1:
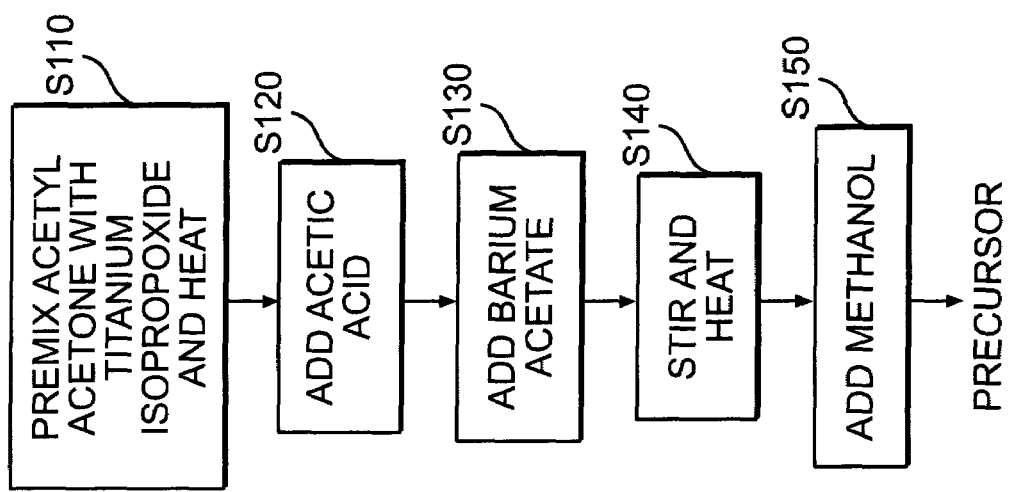
FIG. 1 is a block diagram illustrating a process for preparing a precursor solution used to form a dielectric.

FIG. 1 is a block diagram illustrating a process for preparing a precursor solution that will be used to form a dielectric according to the present invention. In step S110, titanium isopropoxide is premixed with acetyl acetone and heated. The premix step can be done in, for example, a PYREX® container, and heating may take place on a hot plate with a surface temperature of about 90° C. In step S120, acetic acid is added to the Ti isopropoxide/acetylacetone mixture. In step S130, barium acetate is added into the container, and stirred until the barium acetate is dissolved (if doping chemicals are used, they may be added after either step S120 or step S130). In step S140, the solution is stirred while heated at 90° C. for a heating time of about 1 hour. In step S150, methanol is added to the solution to yield a 0.3 molar concentration. The precursor solution is now suitable for deposition.

FIG. 2 is a block diagram of one method for forming a capacitor according to the present invention. The dielectric of the resultant capacitor may be formed using the precursor solution discussed above with reference to FIG. 1. Variants of the methanol, acetylacetone and titanium isopropoxide components in the above-described precursor solution may also be used. For example, methanol may be substituted by increasing the acetic acid content in the precursor solution. Methanol may also be substituted by ethanol, isopropanol, acetone, butanol and other alcohols. Acetylacetone may be substituted by ethanolamines such as 3-ethanolamine, diethanolamine or monoethanolamine, for example. Titanium isopropoxide may be substituted with titanium butoxide.

The solution deposition method illustrated in FIG. 2 is spin coating. Other solution deposition methods, such as dip, slot die, gravure or spray coating, are also suitable for depositing the precursor solution. The process illustrated in FIG. 2 discusses the formation of a single capacitor. Several capacitors can be formed in a batch mode, however, using the method illustrated in FIG. 2.

In step S210, a metallic foil is cleaned. The metallic foil may be made from copper. Copper foils are desirable due their low cost and ease of handling. The copper foil will serve as a substrate on which a capacitor is built. The copper foil also acts as a capacitor "bottom" electrode in the finished capacitor. In one embodiment, the substrate is an 18 µm thick electroless, bare copper foil. Other untreated foils, such as 1 oz copper foil, are also suitable. Suitable cleaning conditions include etching the foil for 30 seconds in a dilute solution of copper chloride in hydrochloric acid. The etching solution may be diluted approximately 10,000 times from its concentrated form. The cleaning process removes the excess oxide layer, fingerprints and other accumulated foreign matter from the foil. If the copper foil is received from a vendor or other source in a substantially clean condition, and is handled carefully and promptly used, the recommended cleaning process may be not be necessary.

The copper foil is preferably not treated with organic additives. Organic additives are sometimes applied in order to enhance adhesion of a metallic substrate to epoxy resins. Organic additives, however, may degrade the dielectric film during annealing.

In step S220, the precursor solution discussed above with reference to FIG. 1 is deposited over the copper foil substrate. The precursor solution may be applied using, for example, a plastic syringe. The precursor solution is deposited on the drum side (or "smooth side") of the copper foil substrate.

In step S230, the substrate is rotated for spin coating. A suitable rotation time and speed are 30 seconds at 3000 revolutions per minute. In step S240, the substrate is heat-treated. Heat treatment may be performed, for example, at a temperature of 250° C. for five minutes. Heat treatment is used to dry the precursor solution by evaporating solvents in the precursor solution.

In step S250, the coated substrate is annealed. Annealing first removes residual organic material, and then densifies and crystallizes the dried dielectric precursor. Annealing may be conducted in a high temperature, low oxygen partial pressure environment. A suitable total pressure environment is about 1 atmosphere. A suitable oxygen partial pressure is about $10^{-10}$ atmospheres.

In step S250, the low oxygen partial pressure may be achieved by bubbling high purity nitrogen through a controlled temperature water bath. Other gas combinations are also possible. In one embodiment, the furnace temperature is at least about 900° C., and the oxygen partial pressure is slightly less than $10^{-10}$ atmospheres. The water bath may be at a temperature of about 25° C. The annealing can be performed by inserting the coated foil substrate into a furnace at temperatures below 250° C. The furnace is then ramped up to 900° C. at a rate of about 30° C./minute. The furnace is maintained at 900° C. for 30 minutes.

In step S260, the foil substrate is allowed to cool. Cooling may be governed by a Newtonian profile, for example, created by simply switching the furnace off. Alternatively, the furnace temperature may be ramped down at a specific rate. When the furnace temperature reaches about 450° C., the foil substrate may be safely removed from the furnace without risk of undesired oxidation effects on the copper foil. Alternatively, the furnace may be allowed to return to room temperature before the foil substrate is removed from the furnace.

The high anneal temperature of 900° C. described above for densification and crystallization of the deposited dielectric provides desirable physical properties that lead to desirable electrical properties in the dielectric after re-oxygenation. One desirable physical property is a dense microstructure. Another desirable physical property is a resultant grain size of between 0.1 and 0.2 micron.

After annealing, the dielectric layer is about 150 nm thick. Consecutive spinning steps may be used to coat the foil substrate to the desired final thickness. Three spinning steps, for example, may be used to produce a final dielectric thickness of approximately 0.5 µm.

The high anneal temperatures of the present invention are made possible by selecting the proper combination of precursor composition, substrate and the correct partial pressure of oxygen for the annealing temperature. A processing temperature of 900° C. is disclosed in step S250. Favorable results may also be obtained, however, using processing temperatures in the range of 800–1050° C. and similar atmospheres.

The above-described annealing process generally avoids oxidation of the copper foil to $Cu_2O$ or $CuO$, although slight oxidation may be acceptable in certain applications. Oxidation is avoided by selecting an appropriate low oxygen partial pressure for the high processing temperature used during annealing in step S250. Depending upon the level of acceptable oxidation, oxygen partial pressures higher than $10^{-10}$ atmospheres may be used. For example, phase stability diagrams predict that at 900° C., copper will remain as copper and any copper oxide will reduce back to copper at 900° C. if the partial pressure of oxygen is less than approximately $10^{-8}$ atmospheres. Therefore, annealing may be undertaken at 900° C. using a partial pressure of oxygen of less than $10^{-8}$ atmospheres. Annealing at a partial pressure of oxygen of approximately $10^{-8}$ atmospheres, however, may induce minor oxidation of the copper at lower temperatures. Annealing at $10^{-9}$ atmospheres may induce still less oxidation in copper.

In order to avoid oxidation of the copper and to provide a wide safety margin, an oxygen partial pressure may be chosen to be considerably more reducing to copper than requirements predicted by phase stability diagrams. For example, a partial pressure of oxygen of $10^{-13}$ atmospheres may be used. However, a range of oxygen partial pressures that reliably avoids oxidation of copper and does not deleteriously reduce the dielectric is between $1\times10^{-9}$ and $1\times10^{-11}$ atmospheres. Consequently, high quality $BaTiO_3$ layers may be formed in the absence of any oxidation of the copper foil or severe dielectric degradation during annealing.

In step S270, the barium titanate dielectric layer or film is subjected to a re-oxygenation process. Re-oxygenation may correspond to a 15 minute anneal at 600° C., at an oxygen partial pressure in the range of $10^{-7}$ and $10^{-2}$ atmospheres. Re-oxygenation can be integrated into the cooling step S260, for example, or performed as a separate step after cooling. After re-oxygenation, the dielectric develops several desirable electrical properties. One desirable electrical property for the dielectric is a low loss tangent, which may be less than 2.5%. An additional desirable electrical property is a high dielectric constant. In general, dielectric constants of polycrystalline $BaTiO_3$-based materials fall precipitously when the average grain size falls below 0.1 micron, and grain sizes of at least this order are therefore desirable. According to the above-described annealing and re-oxygenation methods of the present invention, typical average grain sizes of between 0.1 micron and 0.2 micron can be obtained in dielectrics, providing dielectric constant values in excess of 2000. By contrast, grain sizes of conventionally-processed thin film $BaTiO_3$ are in the range of 0.01 micron, and dielectric constants are generally less than about 350.

In step S280, a "top" electrode is formed over the resulting dielectric. The foil substrate serves as the bottom electrode of the capacitor formed by this method. The top electrode can be formed by, for example, sputtering, combustion chemical vapor deposition, electroless plating, printing or other suitable deposition methods. In one embodiment, sputtered platinum electrodes are used. Other suitable materials for the top electrode include nickel, copper, and palladium. The top electrode may be plated with copper to increase its thickness.

The above-described method for forming a capacitor does not require specialty gases or equipment. The method is also amenable to high-volume manufacturing processes. While CSD is one preferred method for forming the dielectric, the dielectric can alternatively be formed by sputtering, laser ablation, chemical vapor deposition, and other methods.

Figure 3:
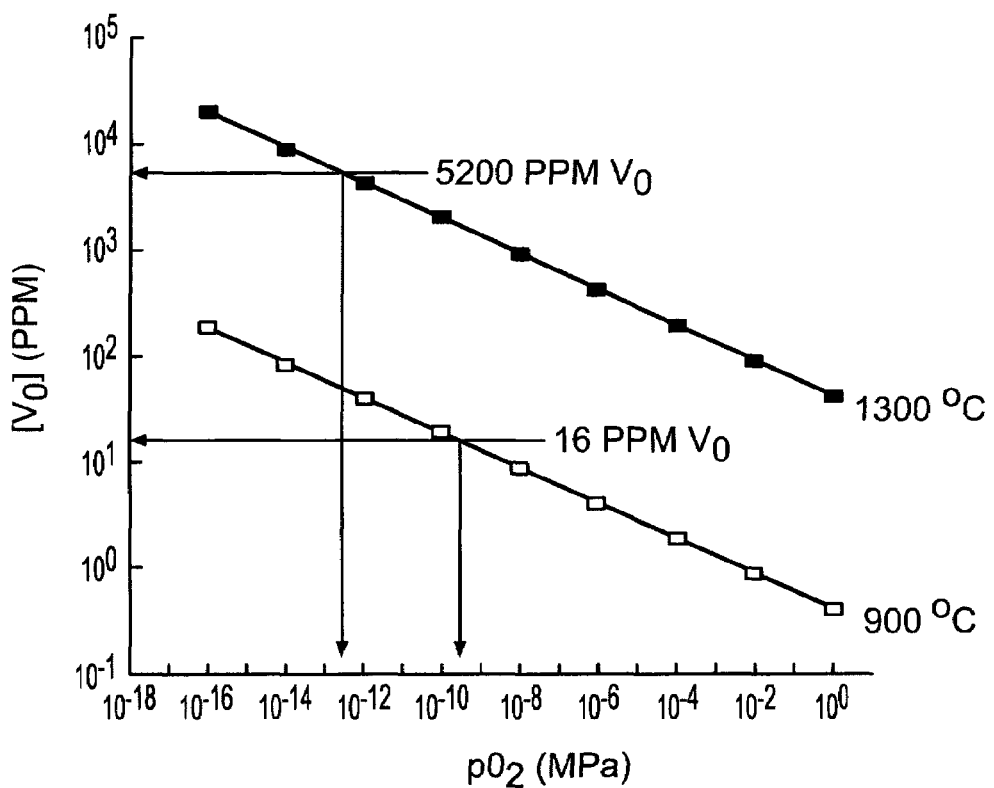
FIG. 3 is a calculated plot of equilibrium oxygen vacancy concentrations ($V_O$) expected for pure $BaTiO_3$ prepared under a range of temperature and oxygen partial pressure combinations.

FIG. 3 is a calculated plot of equilibrium oxygen vacancy defect concentrations ($V_O$) expected in pure barium titanate annealed at 1300° C. (solid rectangles) and at 900° C. (hollow rectangles) as a function of oxygen partial pressure ($pO_2$). The plot is derived from empirical activation energy of oxygen vacancy concentration data disclosed in "Defect Chemistry of Metal Oxides," D. M. Smyth, Oxford University Press, 2000, Chapter 14. In FIG. 3, the 1300° C. data set illustrates ceramic sintering processes used for densification of capacitor dielectrics made from unfluxed $BaTiO_3$ powders and nickel electrodes. When nickel electrodes are used, however, an oxygen partial pressure of $5\times10^{-13}$ atmospheres or lower is required to prevent oxidation of the nickel. The 1300° C. sintering process yields an oxygen vacancy concentration (or "defect density") of approximately 5200 parts per million (PPM) in pure (undoped) $BaTiO_3$. Since oxygen vacancies can be easily ionized at room temperature, pure barium titanate capacitors with defect densities of 5200 PPM will have very poor insulation properties. Re-oxygenation of the $BaTiO_3$ at lower temperatures in an oxygen-containing atmosphere is therefore required in order to reduce the defect concentration to an acceptable level. For pure barium titanate processed with nickel electrodes, however, the defect level requires a sufficiently high temperature and oxygen level on re-oxygenation so that the nickel will oxidize. Consequently, $BaTiO_3$ processed at 1300° C. with nickel electrodes is pre-doped with acceptors. Doping with acceptors, however, reduces the dielectric constant from that which is obtainable with pure $BaTiO_3$.

According to an embodiment of the present invention, a 900° C. anneal is used to densify pure $BaTiO_3$. A 900° C. anneal allows copper to be used as the substrate. To prevent oxidation of the copper, an oxygen partial pressure of about $10^{-10}$ atmospheres or lower is used. Using the data from FIG. 3, this combination of annealing temperature and oxygen partial pressure yields a $BaTiO_3$ dielectric with an expected defect density of about 16 PPM. A defect density of 16 PPM is sufficiently low such that pure $BaTiO_3$ can be successfully re-oxygenated at a lower temperature and at a partial pressure of oxygen that does not oxidize the copper. Doping with acceptors such as Y may therefore be unnecessary. In other embodiments, anneal temperatures in the range of 800–1050° C., and oxygen partial pressures of less than $10^{-8}$ are used.

The following examples illustrate favorable properties in dielectrics prepared according to the present invention, and the capacitors incorporating the dielectrics.

EXAMPLES

Example 1

Barium Titanate ($BaTiO_3$) Dielectric Produced Directly on Copper Foil

A fired-on-foil thin film undoped $BaTiO_3$ dielectric was formed from the following precursor solution:

| | |
|---|---|
| Barium acetate | 2.6 g |
| Titanium isopropoxide | 2.9 ml |
| Acetylacetone | 2.0 ml |
| Acetic acid | 10.0 ml |
| Methanol | 15 ml |

The precursor solution was prepared and deposited on a clean 0.5 oz. copper foil as described with reference to FIGS. 1 and 2. No dopants were added to the precursor solution. Annealing was performed at 900° C. for 30 minutes in an atmosphere containing a partial pressure of oxygen of $10^{-10}$ atmospheres. The annealed thickness of the resultant dielectric was approximately 0.5 micron. Re-oxygenation was performed at 600° C. for 20 minutes in an atmosphere containing a partial pressure of oxygen of $10^{-7}$ atmospheres. A top platinum (Pt) electrode was sputtered onto the dielectric.

Figure 4:
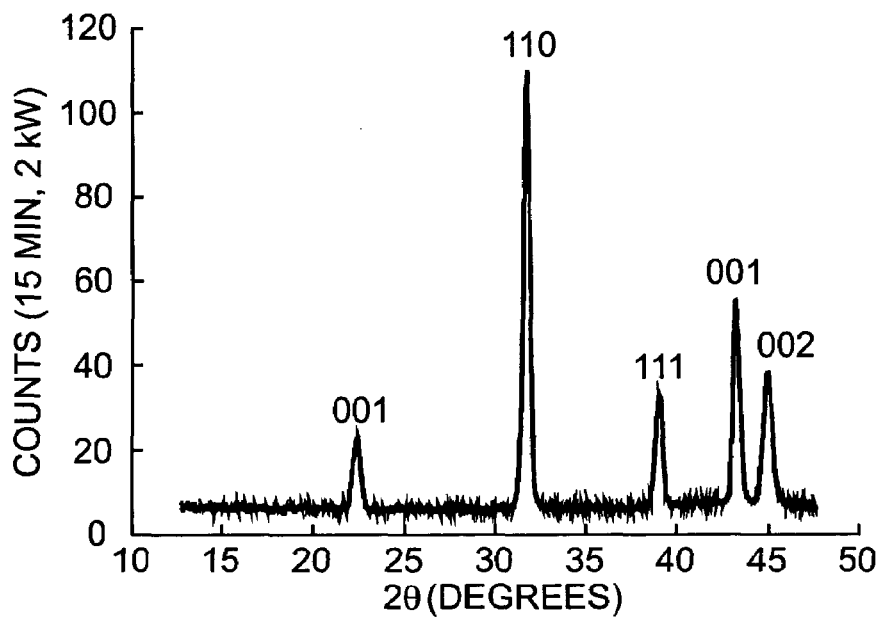
FIG. 4 is a plot of an x-ray diffraction analysis for a $BaTiO_3$ dielectric formed on copper foil.

FIGS. 4–7 show experimental data collected for the undoped $BaTiO_3$ capacitor prepared on copper foil according to Example 1. FIG. 4 is a plot of an x-ray diffraction analysis for the undoped $BaTiO_3$ dielectric. The "001" peak at 34 degrees corresponds to the copper substrate, and the other peaks correspond to $BaTiO_3$. The x-ray diffraction data shows the dielectric to have a high level of crystallinity.

Figure 5:
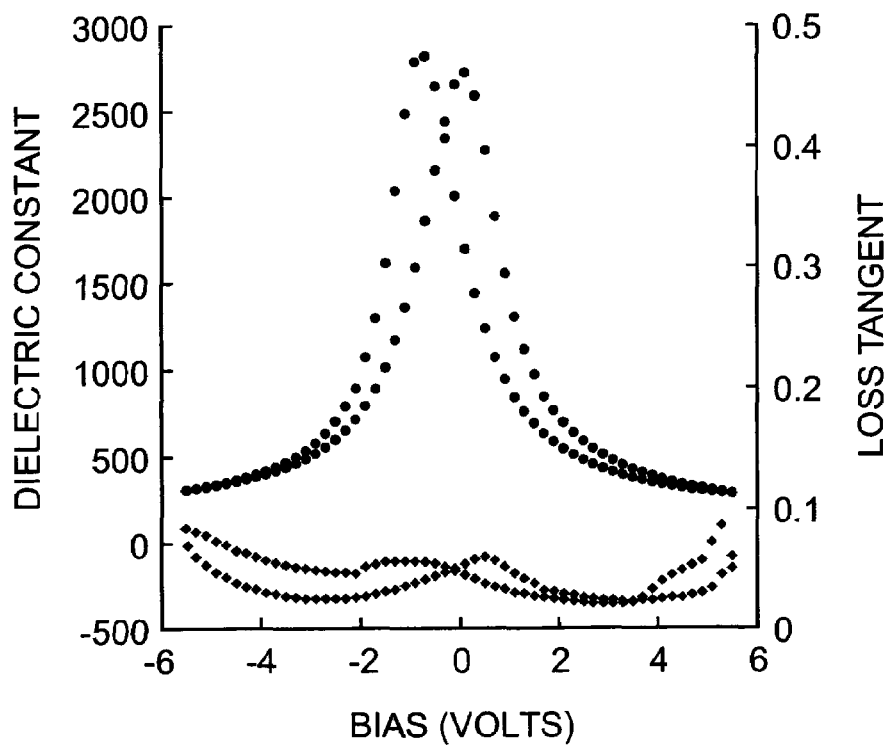
FIG. 5 is a plot of measured dielectric constants and loss tangent values versus applied voltage for a $BaTiO_3$ capacitor formed on copper foil.

FIG. 5 is a plot of dielectric constant (solid dot data sets) and loss tangent (diamond data sets) versus applied voltage for the undoped $BaTiO_3$ dielectric. Data points were collected while the applied voltage was ramped up and while the applied voltage was ramped down and the polarity reversed. The data illustrate the expected hysteresis behavior of $BaTiO_3$, the normal tunable nature of crystalline pure $BaTiO_3$, a high dielectric constant of approximately 2800, and a low loss factor.

Figure 6:
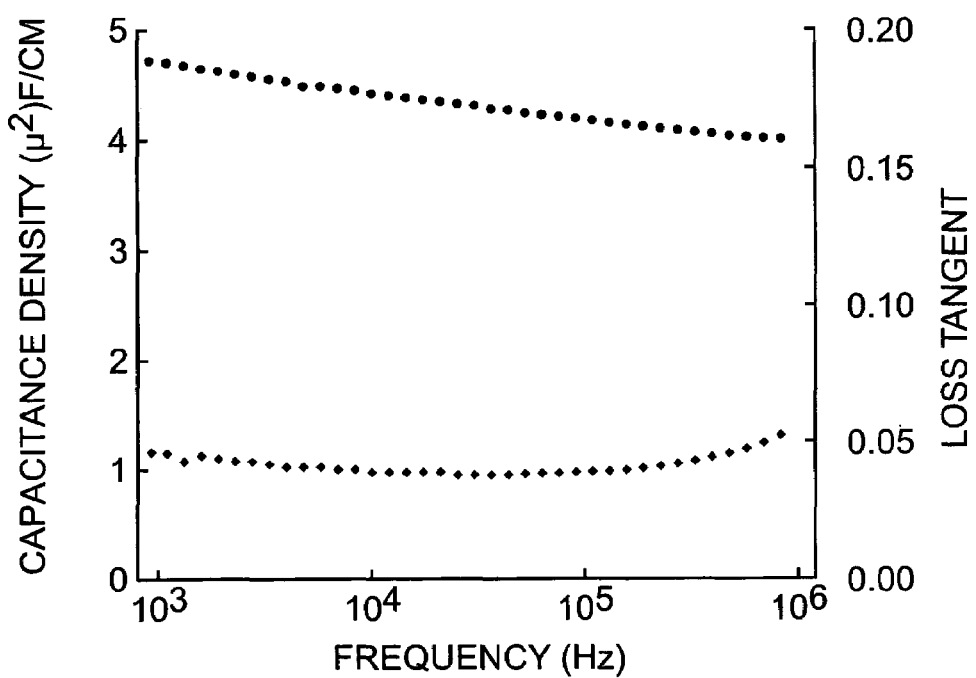
FIG. 6 is a plot of measured capacitance density and loss tangent values versus frequency for a $BaTiO_3$ capacitor formed on copper foil.
Figure 7:
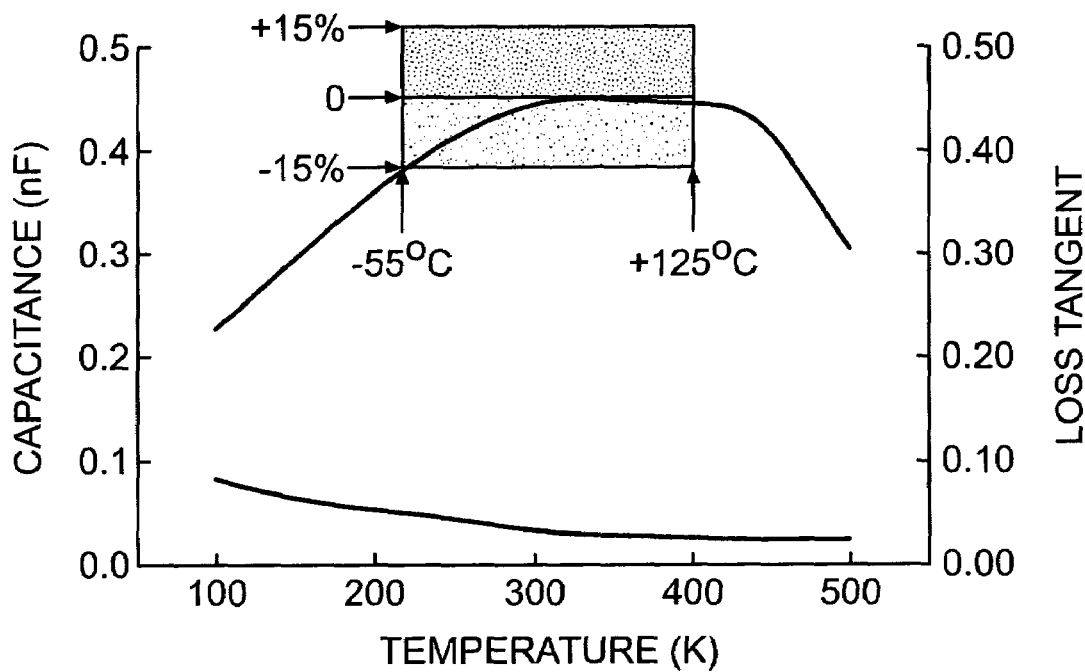
FIG. 7 is a plot of measured capacitance and loss tangent values versus temperature for a $BaTiO_3$ capacitor formed on copper foil.

FIG. 6 illustrates a capacitance density (solid dots) of between 4 and 5 microFarad/$cm^2$ and an acceptably low loss tangent (rectangles) over a wide range of frequencies. FIG. 7 illustrates measured capacitance (upper curve) and loss tangent (lower curve) versus temperature (in Kelvins). FIG. 7 illustrates that the capacitor substantially meets the Electrical Association Industries designation of X7R.

Figure 8:
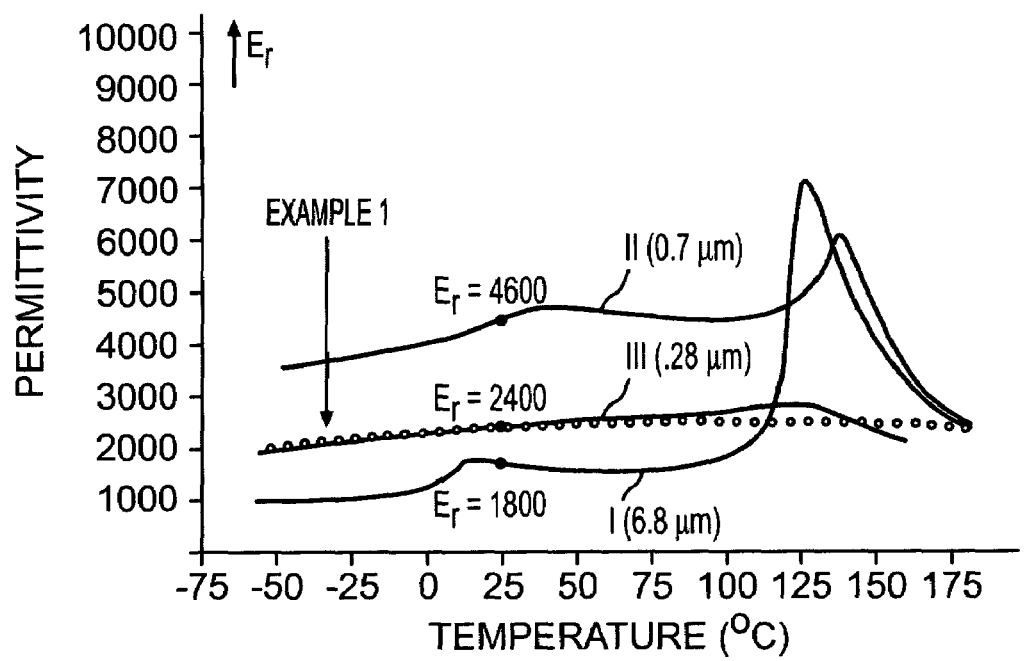
FIG. 8 is a plot of measured permittivity vs. temperature for a $BaTiO_3$ capacitor formed on copper foil and for other $BaTiO_3$ capacitors having different grain sizes.

FIG. 8 illustrates permittivity (dielectric constant) vs. temperature for the pure $BaTiO_3$ capacitor on copper foil of Example 1 (open circles). FIG. 8 also illustrates experimental data (curves I, II, and III) measured from ceramic capacitors made from powders and having different grain sizes. The data are taken from G. Arlt, D. Hennings and G. de With, "Dielectric Properties of Fine Grained Barium Titanate Ceramics," J. Appl. Phys., 58, (4), 1619, 1985. Specific permittivity values for the different dielectrics at 25° C. are noted in FIG. 8. As shown in FIG. 8, the permittivity of the barium titanate prepared according to Example 1 (open circle data set) compares well with barium titanate made from powders and having a grain size of 0.28 micron (curve III). The present method is therefore effective in obtaining in thin films the dielectric constants of crystalline barium titanate made from powders.

FIG. 8 illustrates that higher dielectric constants may be achieved with larger grain sizes, such as 0.7 micron (curve II). However, several grains across a dielectric film (i.e., the width of the film between electrodes) are desirable because they provide acceptable long-term capacitor reliability. Grain size may therefore be tailored to accommodate a desired thickness for the dielectric. For example, for a dielectric thickness of 0.5–1.0 micron, an average grain size of 0.1–0.2 micron allows for approximately 5–8 grains extending from one electrode to the other. In general, 5–8 grains across a dielectric provides acceptable long-term capacitor reliability. Average grain sizes in the range of 0.1–0.2 micron may be achieved using the method described in Example 1. For thicker dielectrics, such as dielectrics of 2 micron thickness, larger grain sizes in the range of 0.2–0.4 micron may be acceptable and correspondingly higher dielectric constants may be realized. Larger grain sizes may be obtained by use of higher annealing temperatures or longer annealing periods, or combinations thereof. For example, grain sizes of 0.2–0.4 micron can be achieved using annealing temperatures in the range of 900–1050° C. for a time of between 30 minutes and 1 hour. If dielectrics thinner than 0.5 micron are desired, lower annealing temperatures or shorter annealing times may be used to create smaller grains.

In accordance with the present invention, base metal compatibility with copper is achieved in a thin film $BaTiO_3$ dielectric embodiment. The resultant annealed dielectric has excellent physical characteristics, and a brief re-oxygenation anneal produces excellent electrical properties.

$BaTiO_3$ is a preferred core material in the formation of dielectrics according to the present invention. The embodiment discussed in Example 1 is addressed to a barium titanate dielectric formed without doping. The ability to produce high quality electrical properties without doping suggests that optimized properties can be achieved with very low doping levels. For example, small quantities of substituent and dopant cations may be added to $BaTiO_3$ to modify the resulting dielectric characteristics. Suitable dopants include rare earth cations having the preferred oxide stoichiometry of $R_2O_3$, where R is a rare earth cation (e.g., Y, Ho, Dy, La, Eu). Rare earth dopants improve insulation resistance in the resulting dielectric.

Transition metal cations with the preferred oxide stoichiometry of $MO_2$ may also be suitable dopant cations. In these cations, M is a transition metal cation (e.g., Zr, Hf, Sn, Ce). Transition metal cations smooth the temperature-dependence of permittivity in the dielectric by "pinching" (shifting) the three phase transitions of $BaTiO_3$ closer to one another in temperature space. Metal cations having the preferred oxide stoichiometry of MO, where M is an alkaline earth metal (e.g., Ca, Sr, Mg), may also be desirable. Metal cations can shift the dielectric temperature maxima to lower temperatures, further smoothing the temperature-dependent response of the dielectric. Transition metal cations such as Mn and Fe may be desirable due to their ability to improve insulation resistance in the dielectric. The above-described dopants, or mixtures thereof, may be used with $BaTiO_3$ in various concentrations. A preferred range of concentrations is between about 0 and 5 mole percent.

For the preparation of doped compositions, the following chemicals can be used in the above-described precursor solution to supply cations: Mn: magnesium acetate tetrahydrate; Y: yttrium acetate hydrate; Zr: zirconium propoxide; Ca: calcium acetate hydrate; Sr: strontium acetate hydrate; Ho: holmium acetate hydrate; Dy: dysprosium acetate hydrate; Hf: hafnium chloride; Fe: Iron acetate; and Mg: magnesium acetate tetrahydrate.

If lower loss tangents are desired, relatively small amounts of dopants, such as 1 mol % strontium substitution for barium, or a 1–3 mol % substitution of zirconium for titanium, can be used to shift the curve in FIG. 7 to the left along the horizontal axis, thereby improving the loss tangent.

Example 2

Yttria-Doped Barium Titanate Dielectric

Figure 9:
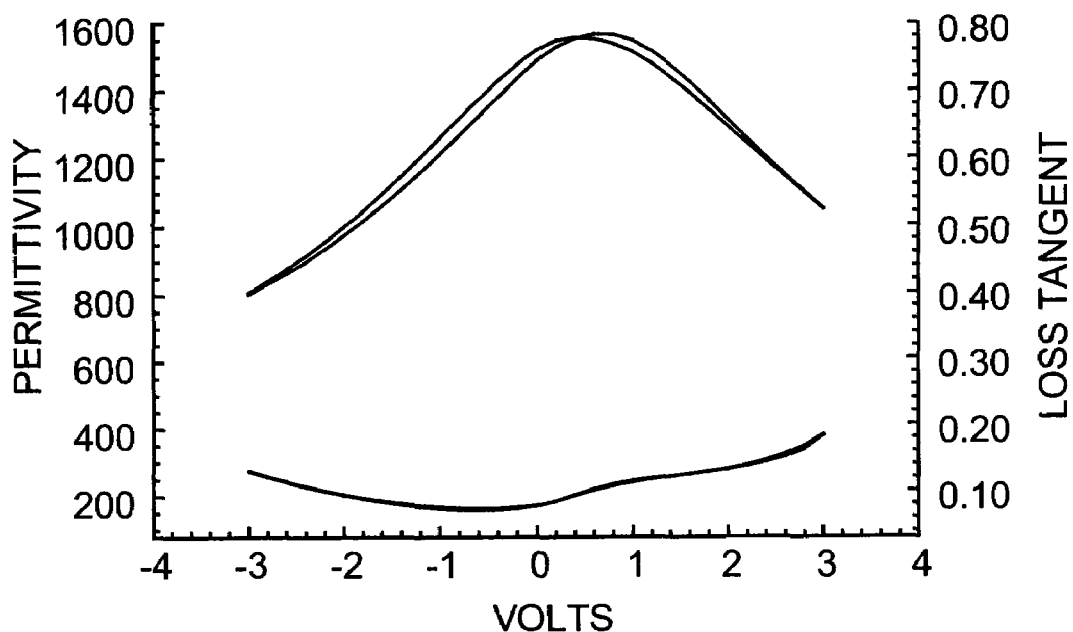
FIG. 9 is a plot of measured permittivity and loss tangent values versus applied voltage for a Y-doped $BaTiO_3$ capacitor formed on copper foil.

FIG. 9 is a plot of measured permittivity (upper data set) and loss tangent (lower data set) versus bias voltage for a thin film Y-doped $BaTiO_3$ capacitor prepared on a copper foil substrate. Data was collected during the voltage ramp up and during the ramp down. The overlapping curves illustrate the expected hysteresis behavior. A high permittivity value of approximately 1600 was achieved with yttrium doping.

The dielectric was prepared by adding 1 mol % Y to the precursor solution as described in Example 1. The precursor was then solution-deposited to form a dielectric layer. Annealing and re-oxygenation of the dielectric layer was performed as in Example 1. The resultant dielectric composition is described generically as: $(Ba_{1-x}Y_x)(Ti_{1-y}Y_y)O_3$ where $0<x<1$ and $0<y<1$. The specific precursor solution composition was:

| | |
|---|---|
| Barium acetate | 2.6 g |
| Yttrium acetate | 0.27 g |
| Titanium isopropoxide | 2.9 ml |
| Acetylacetone | 2.0 ml |
| Acetic acid | 10.0 ml |
| Methanol | 15 ml |

In Example 2, a dielectric layer or film was prepared on 0.5 oz copper foil in the same manner as described in FIGS. 1 and 2. The yttrium acetate was added after addition of barium acetate (step S130 in FIG. 1). A top platinum electrode was sputtered onto the dielectric. Grain sizes were similar to those obtained in Example 1. Example 2 demonstrates that rare earth dopants may be added if desired, but dielectric constants will be reduced in a manner as expected when using such dopants. Acceptor dopants such as Y, however, may be added if more reducing atmospheres, such as oxygen partial pressures in the range of $10^{-12}$–$10^{-16}$ atm, are used in annealing.

Example 3

Barium Titanate Dielectric Prepared on Platinum Foil

In Example 3, a thin film $BaTiO_3$ dielectric film was prepared on a platinum foil substrate, rather than a copper foil. The $BaTiO_3$ dielectric was formed in a manner similar to that of Example 1. The x-ray line widths, from which grain size is calculable, were identical for the dielectric formed on platinum as for the $BaTiO_3$ dielectric formed on copper foil. Accordingly, the x-ray line widths indicate average dielectric grain sizes in the range of 0.1–0.2 micron, and high crystallinity. Choice of foil material therefore appeared to have little or no effect on grain size.

Example 4

Barium Strontium Titanate Dielectric

The above examples utilize $BaTiO_3$ as a core material. In Example 4, barium strontium titanate or BST is utilized as a dielectric core material. In this example, a barium strontium titanate dielectric of composition $Ba_{0.6}Sr_{0.6}TiO_3$ was deposited onto the drum (smooth) side of untreated bare copper foil. The deposition method for the dielectric was sputtering. Sputter conditions were as follows:

5 mTorr
80% Ar, 20% $O_2$
substrate temperature: 100° C. (approx.)
sputter power: 300 W
sputter time: 90 minutes The resulting dielectric thickness was approximately 1 μm. The sputtered dielectric on copper foil was annealed at 900° C. for 30 minutes at an oxygen partial pressure of about $10^{-10}$ atmospheres. Annealing was followed by a re-oxygenation step performed at 700° C. for 20 minutes, at an oxygen partial pressure of $10^{-5}$ atmospheres. A top platinum electrode was sputtered on the dielectric to form the capacitor.

Figure 10:
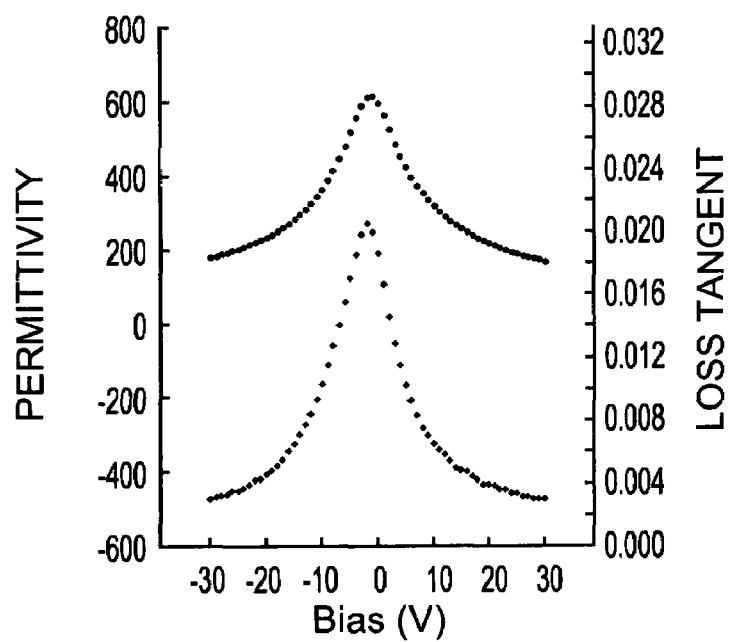
FIG. 10 is a plot of measured permittivity and loss tangent values versus applied voltage for a BST capacitor formed on copper foil.

FIG. 10 shows the measured permittivity (upper data set) and loss tangent (lower data set) for the resultant BST dielectric as a function of bias voltage. The BST dielectric has a lower permittivity than the barium titanate dielectrics discussed in Examples 1 and 2. However, the BST dielectric exhibits a very low loss tangent. The low loss tangent indicates that, consistent with previous examples, only a brief re-oxygenation is necessary to develop good electrical properties. The electrical properties occur over a wide voltage range. Breakdown voltages for BST samples according to Example 4 were approximately 40V.

Example 4 illustrates that high quality BST dielectric films can also be formed on bare copper foil under the same annealing and re-oxygenation conditions that are suitable for $BaTiO_3$ dielectric films.

Capacitors produced according to the above embodiments of the present invention are suitable for embedding in printed wiring boards. The capacitors resulting from the above-described methods and examples may have an entire stack thickness (i.e., the thickness of the substrate, the dielectric, and the top electrode) of less than 20 microns, and maintain a level of flexibility required during the embedding process. In addition, no prohibitively expensive precursor chemicals or precious metals are required to form the capacitors. Examples of capacitors and printed wiring boards are discussed below with reference to FIGS. 11–19.

Figure 12:
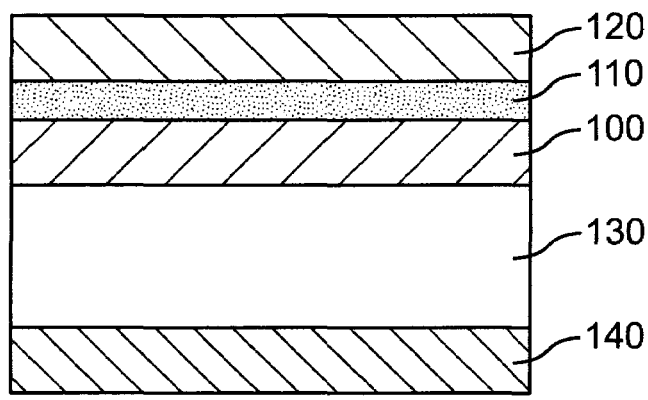
Figure 13:
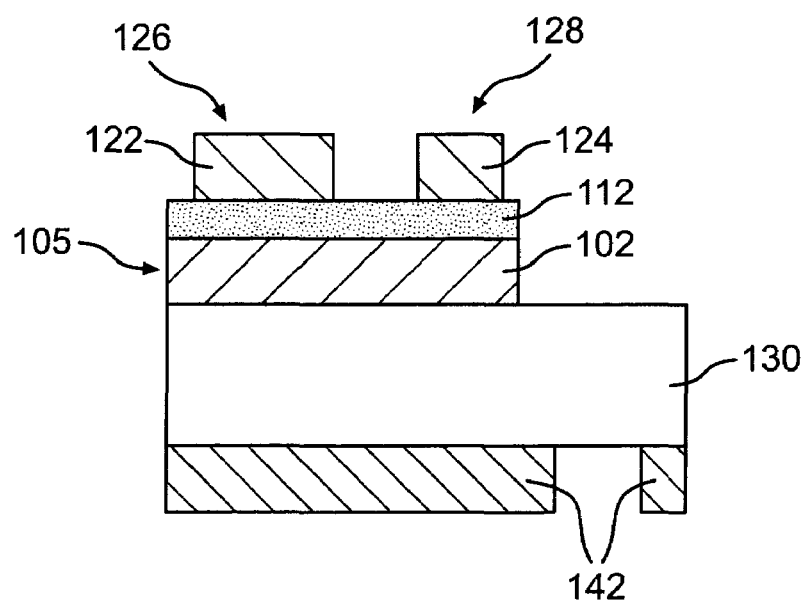
Figure 14:
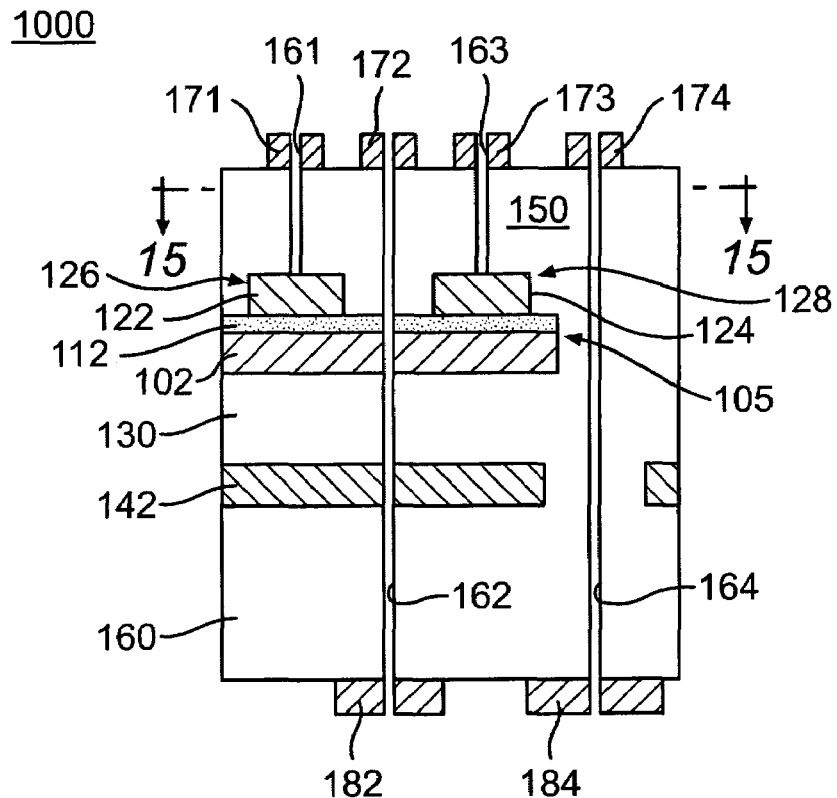
FIG. 14 is a section view in front elevation, taken on line 14—14 in FIG. 15, of a first embodiment of a printed wiring board.
Figure 15:
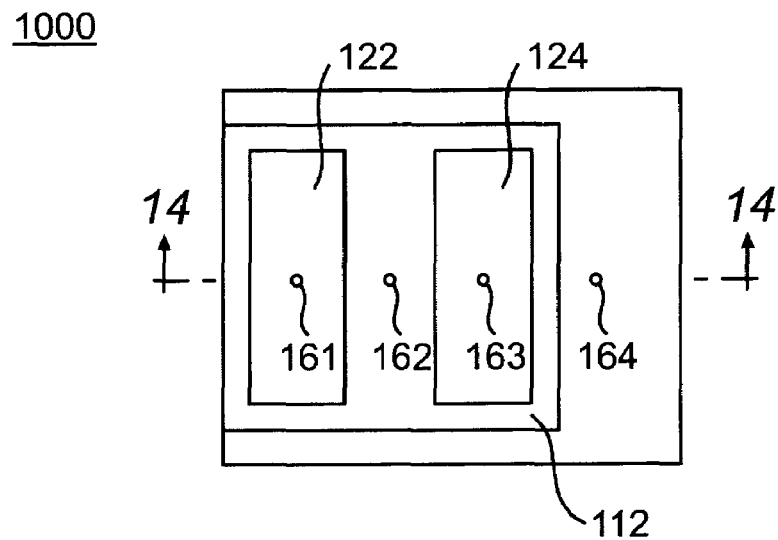
FIG. 15 is a plan section view taken on line 15—15 in FIG. 14.

FIGS. 11–15 illustrate a method of forming an innerlayer panel and of incorporating the innerlayer panel into a printed wiring board 1000. The finished printed wiring board 1000 is illustrated in FIGS. 14 and 15.

Figure 11:
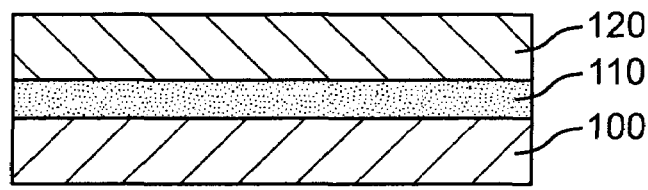
FIGS. 11–13 are schematic section views of applied layers to illustrate a method of making a first innerlayer panel embodiment.

FIG. 11 is a sectional view of a first stage of manufacture of an innerlayer panel. In FIG. 11, a foil 100 is prepared as described in Example 1, resulting in a dielectric layer 110 over the foil 100. However, rather than using a sputtered platinum electrode as described in Example 1, a copper sputtered conductive electrode layer 120 is formed over the entire surface of the dielectric layer 110. The electrode layer 120 may be plated with copper to a desired thickness at this stage or at a later stage. 18 microns is a suitable thickness in one embodiment.

In FIG. 12, the foil 100 is laminated to a laminate dielectric material 130. The lamination can be performed, for example, using FR4 prepreg in standard printing wiring board processes. In one embodiment, type 106 epoxy prepreg may be used. Suitable lamination conditions are, for example, 185° C. at 208 psig for one hour in a vacuum chamber evacuated to about 28 inches of mercury. The dielectric prepreg and laminate materials can be any type of dielectric material such as, for example, standard epoxy, high Tg epoxy, polyimide, polytetrafluoroethylene, cyanate ester resins, filled resin systems, BT epoxy, and other resins and laminates that provide insulation between circuit layers. A conductive foil 140 may be laminated to the laminate dielectric material 130.

Referring to FIGS. 12 and 13, a photo-resist (not shown) is applied to the electrode layer 120 and to the foil 140. The layers of the resulting article are then selectively imaged, etched, and stripped using standard printing wiring board processing conditions. The electrode layer 120 is etched to create individual "top" electrodes 122, 124. The foil 140 is etched to create circuitry 142. Areas of the layers 100, 110, 120 can also be removed by suitable combinations of etching or laser drilling, for example, to provide areas for vias that can be connected to the circuitry 142. FIG. 13 illustrates the resulting innerlayer panel having a "bottom" electrode 102 formed from the foil 100, a dielectric 112, the top electrodes 122, 124, and circuitry 142. The electrode 102, the dielectric 112 and the electrodes 122, 124 form a capacitor structure 105. In the capacitor structure 105, the electrode 102 serves as a common electrode to the electrodes 122, 124. In effect, the capacitor structure 105 comprises two capacitors 126, 128.

FIG. 14 is a section view in front elevation, taken on line 14—14 in FIG. 15, of the printed wiring board 1000. FIG. 15 is a section view taken on line 15—15 in FIG. 14. The printed wiring board 1000 comprises the innerlayer panel illustrated in FIG. 13, and additional laminate dielectric layers and interconnection circuitry.

The printed wiring board 1000 includes four circuit conductors 161, 162, 163, 164 extending through various parts of the printed wiring board 1000. The circuit conductors 161–164 are terminated at one end of the printed wiring board 1000 by circuitry 171, 172, 173, 174, respectively. The circuitry 171–174 can be formed from, for example, a conductive foil formed over laminate dielectric material 150, and may serve as conductive land pads for a semiconductor device, for example. The circuit conductors 162, 164, which are illustrated as plated through-hole vias, are terminated at the other end of the printed wiring board 1000 by circuitry 182, 184. The circuitry 182, 184 is formed over laminate dielectric material 160. The circuitry 142 can act as, for example, a power plane for the printed wiring board 1000. The circuit conductors 161, 163 are coupled to the top electrodes 122, 124, respectively. The circuit conductors 161, 163 are illustrated as plated microvias.

The innerlayer panel illustrated in FIG. 13 can be incorporated into the printed wiring board 1000 by successive laminations. The laminate dielectric materials 150, 160 can be formed from dielectric prepregs, similar to the laminate material 130. Lamination pressings may essentially eliminate the boundaries between laminate layers, and the boundaries between laminate layers 130, 150, 160 are therefore not illustrated.

The printed wiring board 1000 is illustrated as having a single capacitor structure 105. However, the printed wiring board 1000 may have multiple capacitors rather than the two illustrated. Also, two or more innerlayer panels having capacitors and other active and/or passive components can be included in printed wiring boards according to the above embodiment. The exemplary capacitor structure 105 is comprised of two capacitors 126, 128, but other capacitor arrangements are also suitable. The capacitor structure 105, including the dielectric 112, can be formed according to any of the methods discussed above for forming high capacitance density dielectrics.

Figure 16:
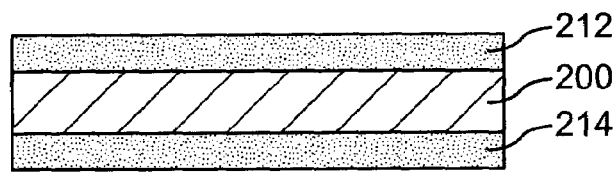
FIGS. 16–17 are schematic section views of applied layers to illustrate a method of making a second innerlayer panel embodiment.
Figure 17:
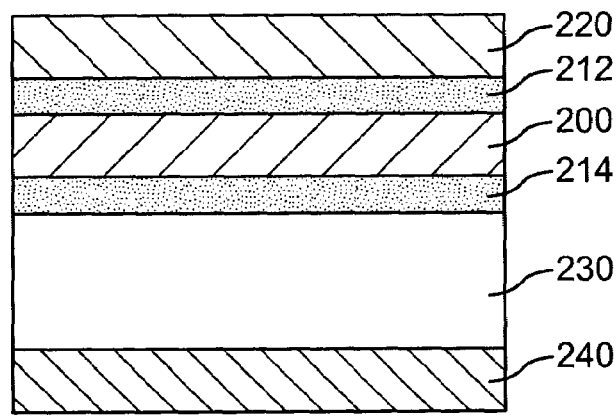
Figure 18:
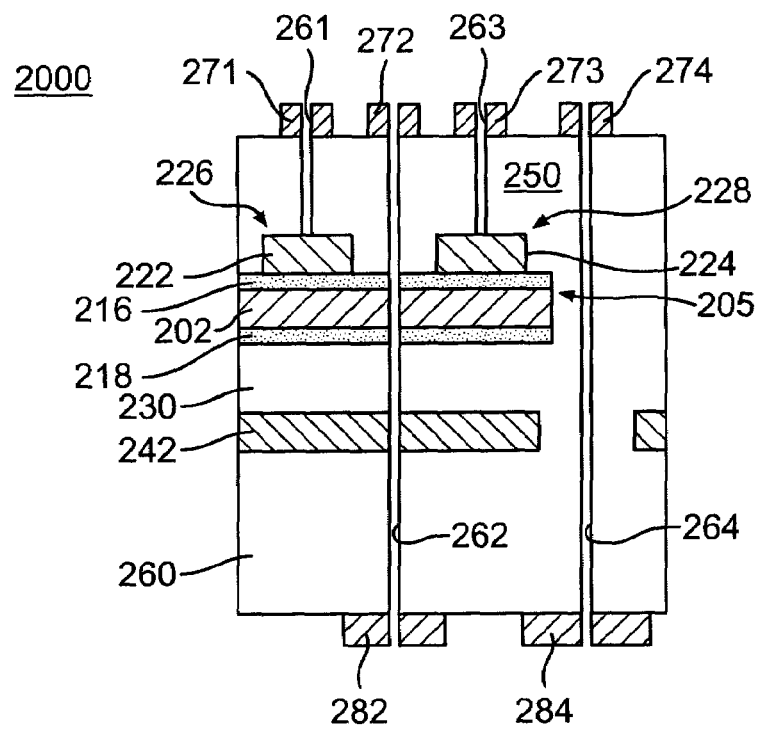
FIG. 18 is a section view in front elevation of a second embodiment of a printed wiring board.

FIGS. 16–18 illustrate an alternative method for forming an innerlayer panel and of incorporating the innerlayer panel into a printed wiring board 2000. In this embodiment, both sides of a foil 200 may be coated with dielectric using dipping or other methods suitable for coating both sides of the copper foil. The finished printed wiring board 2000 is illustrated in FIG. 18.

Referring to FIG. 16, the foil 200 is dipped into a tank containing precursor solution and then withdrawn. The rate of withdrawal may be controlled in order to control thickness. The precursor solution can be any of the precursor solutions discussed above, such as precursor solutions used to form pure and doped barium titanate and barium strontium titanate dielectrics.

The foil 200 is then dried. The dipping and drying procedure is repeated until the desired thickness is achieved. The resulting article is then annealed. Annealing results in a dielectric-clad copper foil 200. The copper foil is clad by dielectrics 212, 214. The dielectric 212 is on the drum side ("smooth side") of the copper foil 200.

Referring to FIG. 17, a copper sputtered conductive electrode layer 220 is formed over the exposed upper surface of the dielectric 212. The entire upper surface of the dielectric 212 may be covered by the layer 220. The electrode layer 220 may be plated with copper to a desired thickness at this stage or at a later stage. 18 microns is a suitable thickness in one embodiment. A laminate dielectric material 230 is laminated to the dielectric 214, and a conductive foil 240 is laminated to the laminate dielectric material 230.

The conductive layer 220 and the foil 240 may be imaged and etched to form any desired combination of electrodes and interconnect circuitry. Vias may also be formed in the article shown in FIG. 17. FIG. 18 illustrates the article of FIG. 17 after etching, and after incorporation into the printed wiring board 2000.

The printed wiring board 2000 may be formed in a manner similar to the printed wiring board 1000 illustrated in FIGS. 14 and 15. The innerlayer panel in the printed wiring board 2000 comprises a bottom electrode 202 formed from the foil 200, a dielectric 216, a dielectric 218, top electrodes 222, 224, and circuitry 242. The electrode 202, the dielectric 216 and the electrodes 222, 224 form a capacitor structure 205. In the capacitor structure 205, the electrode 202 serves as a common electrode to the electrodes 222, 224, which correspond to capacitors 226, 228, respectively. The printed wiring board 2000 may be similar to the printed wiring board 1000, and like elements in FIG. 18 are labeled with like reference numbers to those of the printed wiring board 1000, preceded by a "2" instead of a "1."

The capacitor structure 205 has dielectrics 216, 218 disposed on either side of the foil electrode 202. Cladding the electrode 202 in dielectrics 216, 218 creates a balanced structure that equalizes strain on both sides of the foil used as the substrate (foil 200 in FIG. 16). Therefore, strain during cooling from annealing temperatures is minimal, and the foil 200 therefore is less likely to be warped during cooling.

The printed wiring boards 1000, 2000 may correspond to many different component types. For example, the printed wiring boards 1000, 2000 may be mother-boards, integrated circuit packages or packaging substrates, integrated passive devices, or interposer devices. Embedded capacitors in the printed wiring boards 1000, 2000 may be connected to, for example, integrated circuits, and may be used for functions such as decoupling, energy storage or other functions requiring high capacitance. The electrodes of the capacitors in the printed wiring boards 1000, 2000 can be connected to terminals, such as voltage pins, of integrated circuits by connection circuitry.

The foregoing description of the invention illustrates and describes the present invention. Additionally, the disclosure shows and describes only selected preferred embodiments of the invention, but it is to be understood that the invention is capable of use in various other combinations, modifications, and environments and is capable of changes or modifications within the scope of the inventive concept as expressed herein, commensurate with the above teachings, and/or within the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments, not explicitly defined in the detailed description.

What is claimed is:

1. A method of making a capacitor, comprising:
   providing a bare metallic foil;
   forming a dielectric over the bare metallic foil, wherein forming the dielectric comprises:
   forming a dielectric layer over the foil;
   annealing the dielectric layer, wherein annealing comprises:
   annealing at a temperature in the range of about 800–1050° C. and annealing comprises
   annealing in an environment having an oxygen partial pressure of less than about $10^{-8}$ atmospheres;
   re-oxygenating the dielectric resulting from the annealing; and
   forming a conductive layer over the dielectric, wherein the metallic foil, the dielectric, and the conductive layer form the capacitor.

2. The method of claim 1, wherein annealing results in a dielectric comprising crystalline barium titanate or crystalline barium strontium titanate.

3. The method of claim 1, wherein forming a dielectric layer comprises:
providing a dielectric precursor solution comprising barium acetate and at least one of titanium isopropoxide and titanium butoxide.

4. The method of claim 1, wherein the capacitor has a capacitance density of at least 0.5 microFarad/cm$^2$.

5. The method of claim 1, wherein re-oxygenating the dielectric comprises:
re-oxygenating the dielectric at a temperature in the range of 450–700° C. and an oxygen partial pressure in the range of $10^{-2}$ to $10^{-7}$ atmospheres.

6. The method of claim 1, wherein providing a bare metallic foil comprises:
providing a bare copper foil.

7. The method of claim 1, wherein providing a bare metallic foil comprises:
providing a foil that has not been treated with organic additives.

8. The method of claim 1, wherein forming a dielectric comprises:
forming a dielectric having a thickness in the range of about 0.2–2.0 microns.

9. The method of claim 1, wherein forming a dielectric comprises:
forming a doped dielectric.

10. The method of claim 1, comprising:
etching the conductive layer.

11. A capacitor formed by the method of claim 1.

12. A method of making a capacitor, comprising:
providing a metallic foil;
forming a dielectric over the metallic foil, wherein forming a dielectric comprises:
annealing at a temperature of greater than about 800° C. in an environment having an oxygen partial pressure of less than about $10^{-8}$ atmospheres;
re-oxygenating the dielectric; and
forming a conductive layer over the dielectric, wherein the metallic foil, the dielectric, and the conductive layer form the capacitor.

13. The method of claim 12, wherein annealing comprises:
annealing at a temperature in the range of about 800–1050° C.

14. The method of claim 12, wherein annealing results in a dielectric comprising barium titanate or barium strontium titanate.

15. The method of claim 12, wherein providing a metallic foil comprises:
providing a bare copper foil.

16. The method of claim 1, wherein providing a bare copper foil comprises:
providing a copper foil that has not been treated with organic additives.

17. The method of claim 12, wherein forming a dielectric comprises:
forming a dielectric having a thickness in the range of about 0.2–2.0 microns.

18. The method of claim 12, comprising:
etching the conductive layer.

19. A capacitor formed by the method of claim 12.

20. A method of making a capacitor, comprising:
providing a bare copper foil that has not been treated with organic additives;
forming a dielectric having a thickness in the range of about 0.2–2.0 microns over the copper foil, wherein forming a dielectric comprises:
annealing at a temperature in the range of about 800–1050° C. in an environment having an oxygen partial pressure of less than about $10^{-8}$ atmospheres, wherein the dielectric comprises at least one of barium titanate and barium strontium titanate;
re-oxygenating the dielectric at a temperature in the range of about 450–700° C.; and
forming a conductive layer over the dielectric, wherein the metallic foil, the dielectric, and the conductive layer form a capacitor.

21. A capacitor formed by the method of claim 20.

22. A method of making a printed wiring board, comprising:
forming one or more capacitors using any of the methods recited in claims 1, 12 or 20;
laminating the one or more capacitors with one or more laminate layers; and
forming connection circuitry, wherein the connection circuitry connects to one or more conductive layers or foils of the one more capacitors.

23. The method of claim 22, wherein forming connection circuitry comprises:
forming one or more conductive vias.

24. The method of claim 22, comprising:
connecting one or more conductive layers to a voltage pin of an integrated circuit by way of the connection circuitry.

25. The method of claim 22, comprising:
etching one or more conductive layers before forming connection circuitry.

26. The method of claim 25, wherein etching forms two separate electrodes from a conductive layer.

27. A printed wiring board formed by the method of claim 22.

28. A method of making a capacitor, comprising:
providing a bare metallic foil;
forming a dielectric over the bare metallic foil, wherein forming the dielectric comprises:
forming a dielectric layer over the foil;
annealing the dielectric layer;
re-oxygenating the dielectric resulting from the annealing; and
forming a conductive layer over the dielectric, wherein the metallic foil, the dielectric, and the conductive layer form the capacitor
wherein the dielectric layer is applied to a first side of the foil, the method comprising:
forming a second dielectric layer on a second side of the foil opposite to the first side.

* * * * *

UNITED STATES PATENT AND TRADEMARK OFFICE
CERTIFICATE OF CORRECTION

PATENT NO. : 7,029,971 B2
APPLICATION NO. : 10/621796
DATED : April 18, 2006
INVENTOR(S) : William Borland et al.

It is certified that error appears in the above-identified patent and that said Letters Patent is hereby corrected as shown below:

Col. 15 should read as follows:
Claim 16. The method of claim ~~1~~ 15, wherein providing a bare copper foil comprises: providing a copper foil that has not been treated with organic additives.

Signed and Sealed this

Twelfth Day of August, 2008

JON W. DUDAS
*Director of the United States Patent and Trademark Office*

UNITED STATES PATENT AND TRADEMARK OFFICE
CERTIFICATE OF CORRECTION

PATENT NO.         : 7,029,971 B2  
APPLICATION NO. : 10/621796  
DATED                 : April 18, 2006  
INVENTOR(S)       : William Borland et al.

It is certified that error appears in the above-identified patent and that said Letters Patent is hereby corrected as shown below:

Col. 15, lines 54-57 should read as follows:  
Claim 16. The method of claim ~~1~~ 15, wherein providing a bare copper foil comprises: providing a copper foil that has not been treated with organic additives.

This certificate supersedes the Certificate of Correction issued August 12, 2008.

Signed and Sealed this

Sixteenth Day of September, 2008

JON W. DUDAS  
*Director of the United States Patent and Trademark Office*